United States Patent
Kim et al.

(10) Patent No.: US 12,184,469 B2
(45) Date of Patent: Dec. 31, 2024

(54) ELECTRONIC DEVICE AND OPERATING METHOD TO COMPENSATE FOR IN-PHASE/QUADRATURE IMBALANCE

(71) Applicant: Samsung Electronics Co., Ltd., Suwon-si (KR)

(72) Inventors: Dong Han Kim, Suwon-si (KR); Sung Soo Kim, Seoul (KR); Wan Kim, Uiwang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/168,320

(22) Filed: Feb. 13, 2023

(65) Prior Publication Data

US 2023/0269125 A1   Aug. 24, 2023

(30) Foreign Application Priority Data

Feb. 24, 2022 (KR) .................. 10-2022-0024428
May 13, 2022 (KR) .................. 10-2022-0059076

(51) Int. Cl.
*H04L 25/06* (2006.01)
*H03K 5/01* (2006.01)
(Continued)

(52) U.S. Cl.
CPC ........... *H04L 27/3863* (2013.01); *H03K 5/01* (2013.01); *H03K 2005/00286* (2013.01)

(58) Field of Classification Search
CPC .................. H04L 27/3863; H03K 5/01; H03K 2005/00286
(Continued)

(56) References Cited

U.S. PATENT DOCUMENTS 7,570,923 B2   8/2009   Kiss et al.
7,573,954 B2   8/2009   Wu et al.
(Continued)

FOREIGN PATENT DOCUMENTS

KR   100907575 B1   7/2009

OTHER PUBLICATIONS

European Search Report, dated Jul. 5, 2023, issued in corresponding European Patent Application No. 23158009.3.
(Continued)

*Primary Examiner* — Zewdu A Kassa
(74) *Attorney, Agent, or Firm* — Harness, Dickey & Pierce, P.L.C.

(57) ABSTRACT

An electronic device includes a feedback oscillator configured to output a first oscillation signal and a second oscillation signal, the second oscillation signal having a defined phase difference from the first oscillation signal, the feedback oscillator including a phase shifter configured to receive the first oscillation signal and output the second oscillation signal, an up-conversion mixer configured to output a first loopback signal obtained by mixing the first oscillation signal with a reference tone signal, and output a second loopback signal obtained by mixing the second oscillation signal with the reference tone signal, and a receiver configured to generate a first reference IQ signal from the first loopback signal, generate a second reference IQ signal from the second loopback signal, and compare an actual phase difference between the first reference IQ signal and the second reference IQ signal with the defined phase difference.

20 Claims, 10 Drawing Sheets

(51) Int. Cl.
   *H04L 27/38*    (2006.01)
   *H03K 5/00*     (2006.01)
(58) Field of Classification Search
   USPC .................................. 375/317, 316, 295, 219
   See application file for complete search history.

(56) References Cited

U.S. PATENT DOCUMENTS

```
7,831,215  B2    11/2010  Park et al.
7,925,217  B2     4/2011  Park et al.
8,358,997  B2     1/2013  Mo et al.
8,594,241  B2    11/2013  Kim
8,861,644  B2    10/2014  Chen et al.
8,953,663  B2     2/2015  Kravitz
9,025,645  B2     5/2015  Al-Qaq et al.
9,344,302  B2     5/2016  Dhayni
2007/0189371 A1   8/2007  Yen
2011/0292978 A1  12/2011  Kravitz
2012/0328041 A1* 12/2012  Chen .................... H04L 27/364
                                                       375/296
2019/0049555 A1*  2/2019  Sreekiran ............ H01Q 1/3233
```

OTHER PUBLICATIONS

European Office Action, dated Jul. 17, 2023, issued in corresponding European Patent Application No. 23158009.3.

\* cited by examiner

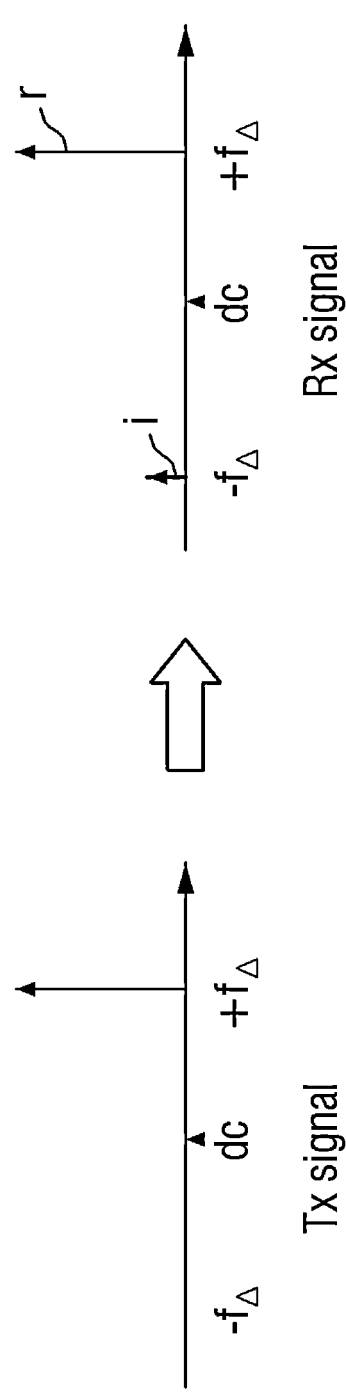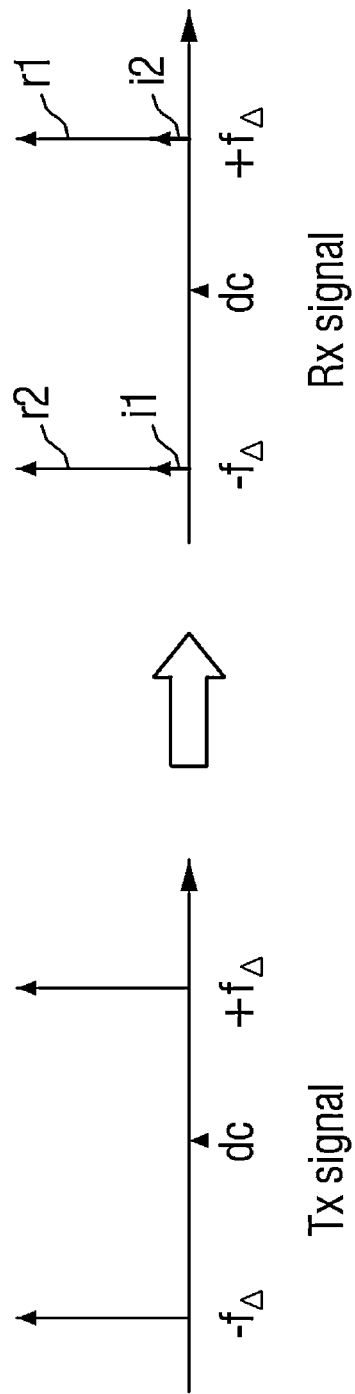

ELECTRONIC DEVICE AND OPERATING METHOD TO COMPENSATE FOR IN-PHASE/QUADRATURE IMBALANCE

CROSS-REFERENCE TO RELATED APPLICATIONS

This application claims priority to Korean Patent Application No. 10-2022-0024428 filed on Feb. 24, 2022 and Korean Patent Application No. 10-2022-0059076 filed on May 13, 2022 in the Korean Intellectual Property Office, and all the benefits accruing therefrom under 35 U.S.C. 119, the contents of which in their entirety are herein incorporated by reference.

FIELD

The present inventive concepts relate to an electronic device and/or an operating method to compensate for in-phase/quadrature imbalance.

BACKGROUND

A technique for converting a baseband signal (hereinafter referred to as a BB signal) or an intermediate frequency signal (hereinafter referred to as an IF signal) into a radio frequency signal (hereinafter referred to as an RF signal) using an in-phase/quadrature mixer (IQ mixer), or converting the RF signal into the BB signal or the IF signal is being widely used in the field of wireless communication.

However, carrier leakage and IQ imbalance occur in an actual IQ mixer. Carrier leakage occurs when the product of an input signal and an IQ local oscillation (IQLO) signal transmitted from a local oscillator is not only transferred to an output terminal of the IQ mixer, but also when the IQ LO signal is leaked to an output terminal of the IQ mixer. IQ imbalance is a concept that includes gain imbalance occurring because the magnitudes of an in-phase signal and a quadrature signal transmitted from a local oscillator to the IQ mixer are not the same as each other, and phase imbalance occurring due to the in-phase signal and the quadrature signal not having a phase difference of 90° therebetween. When I/Q imbalance occurs in a quadrature modulator of a transceiver, error vector magnitude (EVM) degradation may occur and a packet error rate (PER) may increase, thereby decreasing overall communication system performance.

SUMMARY

One example embodiment of the present inventive concepts provides an electronic device including a feedback oscillator configured to output a first oscillation signal and a second oscillation signal, the second oscillation signal having a defined phase difference from the first oscillation signal, the feedback oscillator including a phase shifter configured to receive the first oscillation signal and output the second oscillation signal, an up-conversion mixer configured to output a first loopback signal obtained by mixing the first oscillation signal with a reference tone signal, and output a second loopback signal obtained by mixing the second oscillation signal with the reference tone signal, and a receiver configured to generate a first reference IQ signal from the first loopback signal, generate a second reference IQ signal from the second loopback signal, and compare an actual phase difference between the first reference IQ signal and the second reference IQ signal with the defined phase difference.

Another example embodiment of the present inventive concepts provides an electronic device including a feedback oscillator configured to generate a feedback oscillation signal, a phase shifter configured to output a first oscillation signal having the feedback oscillation signal shifted to a first phase, and a second oscillation signal having the feedback oscillation signal shifted to a second phase, an up-conversion mixer configured to generate and output a first loopback signal by mixing the first oscillation signal with a reference tone signal, and generate and output a second loopback signal by mixing the second oscillation signal with the reference tone signal in a measurement mode, and a receiver configured to generate a first reference IQ signal by down-conversion mixing the first loopback signal, and generate a second reference IQ signal by down-conversion mixing the second loopback signal in the measurement mode. The receiver is configured to estimate a phase offset by comparing a defined phase difference between the first oscillation signal and the second oscillation signal with an actual phase difference between the first reference IQ signal and the second reference IQ signal, and estimate a gain offset from the first reference IQ signal and second reference IQ signal.

Another example embodiment of the present inventive concepts provides a method for operating an electronic device, the method including generating a first oscillation signal by phase-shifting a feedback oscillation signal to a first phase, and generating a second oscillation signal by phase shifting the feedback oscillation signal to a second phase in a measurement mode, generating a first loopback signal by up-conversion mixing a reference tone signal with the first oscillation signal, and generating a second loopback signal by up-conversion mixing the reference tone signal with the second oscillation signal, generating a first reference IQ signal by down-conversion mixing the first loopback signal with a receiver oscillator signal in the receiver, generating a second reference IQ signal by down-conversion mixing the second loopback signal with the receiver oscillator signal in the receiver, and estimating a gain offset and a phase offset of the receiver according to the first reference IQ signal and the second reference IQ signal.

Technical aspects of the present inventive concepts are not restricted to those set forth herein, and other unmentioned technical aspects will be clearly understood by one of ordinary skill in the art to which the present inventive concepts pertain by referencing the detailed description of the present inventive concepts given below.

BRIEF DESCRIPTION OF THE DRAWINGS

The above and other aspects and features of the present inventive concepts will become more apparent by describing in detail example embodiments thereof with reference to the attached drawings, in which:

FIGS. 2 and 3 illustrate a frequency spectrum representing a transmission signal and a reception signal;

DETAILED DESCRIPTION

Hereinafter, some example embodiments of the present inventive concepts will be described with reference to the attached drawings:

The high rate pulse repetition frequency (HRP) ultra-wide Band (UWB) physical layer (PHY), defined in the IEEE 802.15.4z standard, is a technology that transmits and receives signals at a low power over a wide frequency band of 500 MHz, which is a useful communication technology for medium- and low-speed data transmission, ranging, and angle of arrival (AoA) estimation applications. The present inventive concepts relate to a technology for estimating and compensating for an IQ imbalance of a receiver when the receiver receives a signal according to the HRP UWB PHY communication specification defined in the IEEE 802.15.4z standard. The passband signal received from the receiver is converted into a baseband signal by a down-conversion mixer, and when an IQ imbalance offset exists in the down-conversion mixer, reception sensitivity may be degraded, and the accuracy upon estimating AoA may be lowered.

Hereinafter, a transmission/reception circuit of a communication system and an electronic device according to some example embodiments of the present inventive concepts will be described with reference to FIGS. 1 to 10.

Figure 1:
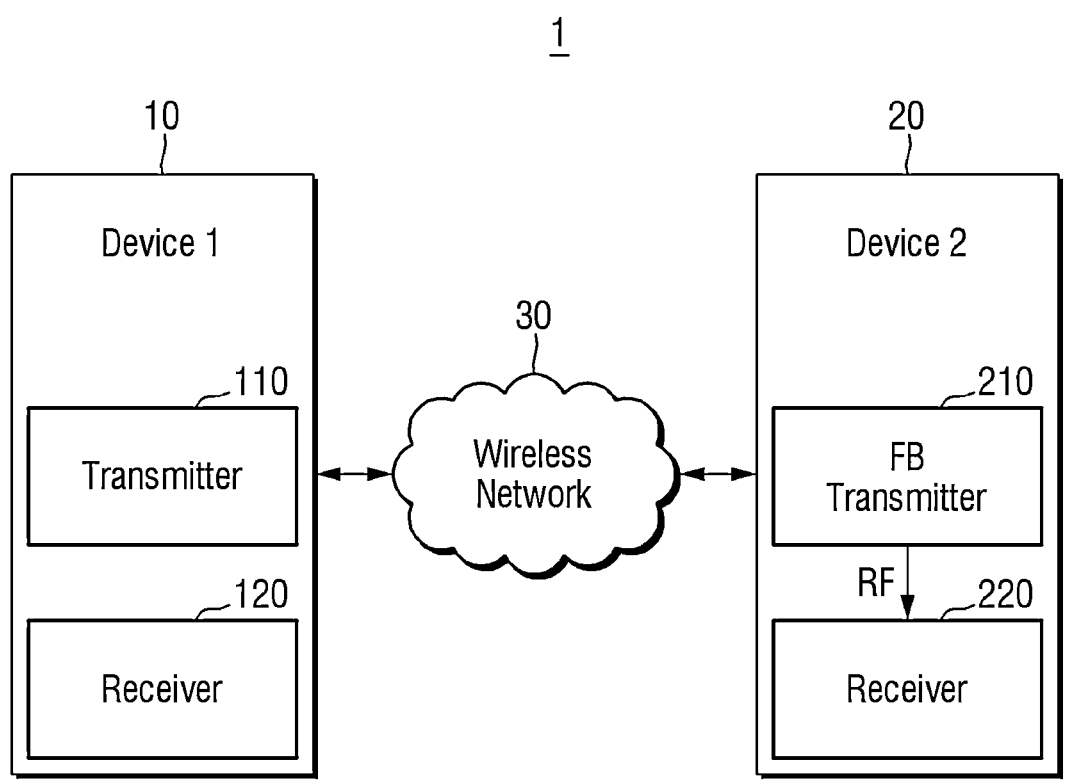
FIG. 1 illustrates a communication system according to some example embodiments.

FIG. 1 illustrates a communication system according to some example embodiments, and FIGS. 2 and 3 illustrate a frequency spectrum representing a transmission signal and a reception signal.

Referring to FIG. 1, the communication system 1 includes a first electronic device 10 and a second electronic device 20, and the first electronic device 10 and the second electronic device 20 are connected to each other via a wireless network 30.

A wireless network may include short-range communication methods, such as Bluetooth, Bluetooth low energy (BLE), near-field communication, WLAN (Wi-Fi), Zigbee, infrared (IrDA), Wi-Fi Direct (WFD), ultra-wideband (UWB), and Ant+ communication, but example embodiments are not limited thereto. Alternatively, the wireless network may include a mobile communication method, and for example, may transmit and receive wireless signals to and from at least one of a base station, an external terminal, and a server on the mobile communication network. According to some example embodiments, a case where the wireless network is a UWB manner will be described, but the scope of the present inventive concepts is not limited thereto.

The UWB manner may load information into a very short impulse having a width of several ns and transmit the information at sampling of a high speed of several GHz, and the first electronic device 10 and the second electronic device 20 may include a transmitting device and a receiving device. The first electronic device 10 may include a transmitting device 110 and a receiving device 120, and the second electronic device 20 may include a feedback transmitting device 210 and a receiving device 220. That is, one electronic device may include at least one transmitter and at least one receiver, and upon the operation in a normal mode, the transmitter and receiver included in one electronic device may independently perform transmission and reception operations, and upon the operation in a measurement mode, the transmitter and the receiver may be connected to each other for a receiver to estimate and compensate for a reception IQ imbalance. In the following description, the feedback transmitting device 210 is described as a feedback transmitter 210 and the receiving device 220 is described as a receiver 220 so that the devices are distinguished from the first electronic device 10, but technical aspects of the present inventive concepts are not limited thereto. Modulation and demodulation may be performed in a burst position modulation (BPM)-binary phase-shift keying (BPSK) manner. The BPM-BPSK manner has the advantage of only generating a transmission signal with a real signal rather than a complex signal.

Because the UWB manner uses a BPSK modulation scheme, the transmitting devices 110 and 210 configured to generate a UWB signal may simply implement a transmitter with only a single signal path without having to implement both a real path and an imaginary path corresponding to the complex signal. However, when the transmitter is simply implemented, there is a restriction in terms of compensation for a reception IQ imbalance.

For example, when a left spectrum in FIG. 2 transmits the complex signal with a reference tone frequency $f_A$, a reception circuit 120 may receive not only a real signal but also an unnecessary imaginary signal as a reception signal. For example, as shown in a right spectrum, the reception circuit 120 may receive the real signal r with a reference tone frequency $f_A$ on the right with respect to a carrier frequency dc and the imaginary signal i with a reference tone frequency $-f_A$, on the left side with respect to a carrier frequency dc.

In a system for transmitting a signal in a wide band such as UWB communication, the imaginary signal i may be added to the real signal r as noise to lead to degrading a signal-to-noise ratio (SNR) of the reception signal (Rx signal).

Accordingly, the reception circuit 120 may estimate a gain mismatch offset and a phase mismatch offset by measuring and analyzing distortion of the signals r and i that are present at two frequencies $f_A$ and $-f_A$ according to the IQ imbalance, respectively. Therefore, in order to accurately measure the offset according to the IQ imbalance of the reception circuit 120, it is desirable to accurately measure the magnitude and phase of the signals of the two frequencies $f_A$ and $-f_A$.

Referring to FIG. 3, according to some example embodiments, it can be found that when transmission circuits 110 and 210 generate a transmission signal based on the real signal, a frequency component is also present in the frequency $-f_A$ other than the reference tone frequency $f_A$. When the real signal generated by the tone generator is $\cos(2\pi f_A t)$, the transmission signal has frequency components at both frequencies $f_A$ and $-f_A$ based on Equation 1.

$$\cos(2\pi f_A t) = \frac{1}{2}e^{j2\pi f_A t} + \frac{1}{2}e^{-j2\pi f_A t} \quad \text{Equation 1}$$

For example, referring to the illustrated spectrum, a transmission signal Tx Signal may have frequency components in each of the reference tone frequency $f_A$ and frequency $-f_A$. When such a transmission signal is transmitted, as described in FIG. 3, the reception circuit 120 may receive not only the real signal of the transmission signal, but also the imaginary signal.

For example, the reception circuit 120 may receive a real signal r1 and an imaginary signal i1 with respect to the transmission signal of the reference tone frequency $f_A$, and may receive a real signal r2 and an imaginary signal i2 with respect to a transmission signal of a frequency $-f_A$. In this case, since the imaginary image signal i1 and the imaginary image signal i2 overlap the real signal r2 and the real signal r1, respectively, it is difficult to accurately measure the magnitudes and phase components of the real signals r1 and r2 and the magnitudes and phase components of the imaginary image signal i1 and the imaginary image signal i2 in the receiving circuit 120.

Figure 4:
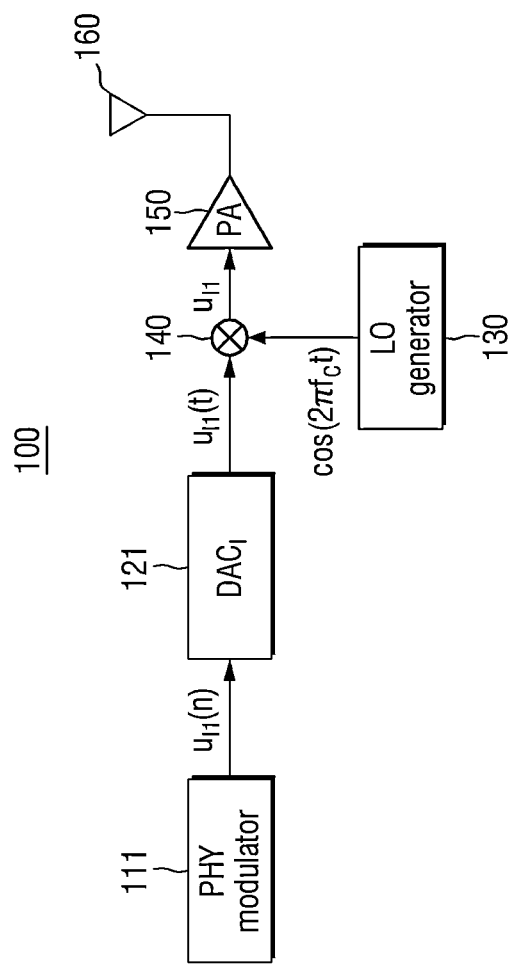
FIG. 4 is a diagram illustrating a transmission circuit according to some example embodiments.

FIG. 4 is a diagram illustrating a transmission circuit 100 according to some example embodiments.

Referring to FIG. 4, according to some example embodiments, the transmission circuit 100 may include a PHY modulator 111, a digital-to-analog conversion (DAC) 121, an LO generator 130, an up-conversion mixer 140, a power amplifier 150, and an antenna 160.

The PHY modulator 111 modulates the transmission signal in the binary phase-shift keying (BPSK) manner and outputs the same signal to a BPSK signal $u_{f1}(n)$. The transmission signal may be a reference tone signal with the reference tone frequency $f_A$. The DAC 120 converts the BPSK signal $u_{f1}(n)$ output from the PHY modulator 111 into an analog signal and outputs the same signal as a baseband signal $u_{f1}(t)$, and the LO generator 130 generates an oscillation signal with a carrier frequency $f_c$, that is, an LO signal. According to some example embodiments, the LO generator 130 may be referred to as a local oscillator or a transmission oscillator.

The up-conversion mixer 140 generates a transmission tone signal $u_{f1}$ in a passband by mixing a local oscillator (LO) signal $\cos(2\pi f_A t)$, which is a transmission oscillator signal, with the reference tone signal $u_{f1}(t)$ in a baseband. The power amplifier 150 and the antenna 160 amplify power for the transmission tone signal un in the passband, which is a radio frequency (RF) signal, and output the same to the wireless network (30 in FIG. 1).

As described above with reference to FIGS. 1 and 2, the transmission circuit 110 may transmit only the real signal with the frequency $f_c$ via a single signal path. Since the transmission circuit 100 not only has a simple structure, but also needs only one LO signal for up-conversion of the signal, there is no degradation in performance caused by the transmission end IQ mismatch offset.

Figure 5:
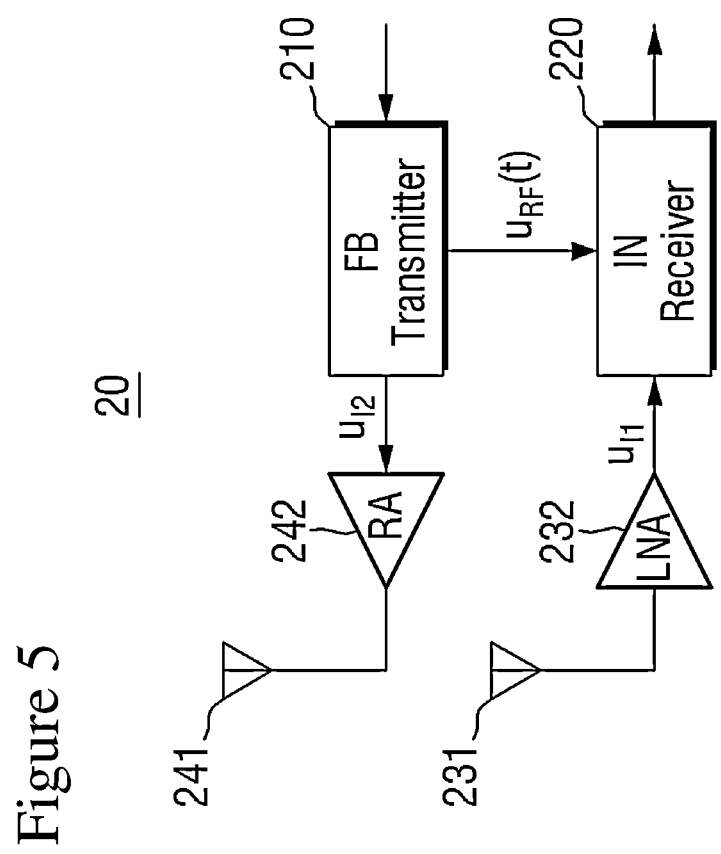
FIG. 5 is a diagram illustrating an electronic device according to some example embodiments.

FIG. 5 is a diagram illustrating an electronic device 20 according to some example embodiments.

Referring to FIG. 5, according to some example embodiments, a second electronic device 20 may include a feedback transmitter 210, a receiver 220, a reception antenna 231, a low noise amplifier 232, a transmission antenna 244, and a power amplifier 242.

The reception antenna 231 receives a passband signal un transmitted via the wireless network (30 in FIG. 1). The low noise amplifier 232 amplifies and outputs the passband signal un so as to reduce or minimize noise according to a noise index (Noise Figure: NF). The passband signal $u_{f1}$ may then be subject to down-conversion mixing to be converted into an input tone signal.

The feedback transmitter 210 may be used for offset measurement of the receiver 220 embedded in the second electronic device 20 in the measurement mode, and may operate as a transmission circuit of the second electronic device 20 in the normal mode. The feedback transmitter 210 is connected to the receiver 220 via a loopback path. The feedback transmitter 210 generates a loopback signal in the measurement mode and fails to generate the loopback signal and operates as a transmitter in the normal mode.

According to some example embodiments, the feedback transmitter 210 phase-shifts the reference tone signal with the reference tone frequency $f_A$ in the measurement mode and outputs the same signal to the loopback signal $u_{RF}(t)$. For example, the feedback transmitter 210 generates at least two loopback signals $u_{RF}(t)$ phase-shifted to at least two different phases preset in the measurement mode and provides the signals to the receiver 220 via the loopback path RF. The loopback signal $u_{RF}(t)$ is a signal in which a signal corresponds to a transmission signal of the first electronic device 10, for example, $u_{f1}(t)$ as an analog signal is generated in the second electronic device 20.

According to some example embodiments, in the normal mode, the feedback transmitter 210 generates the transmission signal based on an input signal of the second electronic device 20 to transmit the signal to the receiving device of the first electronic device 10 and outputs the transmission signal via the power amplifier 242 and the transmission antenna 244.

The receiver 220 sequentially receives at least two loopback signals phase-shifted respectively to at least two different phases having a preset phase difference (or alternatively, a defined phase difference, a desired phase difference, a specified phase difference, etc.) from the feedback transmitter 210 in the measurement mode according to some embodiments. For example, the receiver 220 generates the first and second reference IQ signals that are subjected to down-conversion mixing from the first and second loopback signals, analyzes the first and second reference IQ signals based on the preset phase difference signal and the reference tone signal, and estimates a gain offset and a phase offset generated in an IQ channel of the receiver 220.

For example, the receiver 220 receives a first loopback signal phase-shifted and generated to a preset first phase in the measurement mode, and generates a first reference IQ signal by performing In-phase/quadrature (IQ) mixing for the first loopback signal. The receiver 220 receives the second loopback signal generated phase-shifted and generated to a preset second phase, and generates a second reference IQ signal by performing the IQ mixing for the second loopback signal. Since a difference between the first phase and the second phase preset in the feedback transmitter 210, that is, the preset phase difference, is known within the second electronic device 20, the receiver 220 may compare the generated first reference IQ signal and the generated second reference IQ signal, may calculate an actual phase difference and a signal size, and may then compare the same with the preset phase difference and the reference tone signal, thus calculating a phase offset and a gain offset between an I channel and a Q channel. The receiver 220 may then generate a correction IQ signal by reflecting the gain offset and the phase offset calculated in the measurement mode in a reception IQ signal received via the reception antenna in the normal mode.

According to some example embodiments, the receiver 220 may receive an input tone signal input via the reception antenna 231 in the normal mode, and generate and output the reception IQ signal. The receiver 220 may estimate the gain offset and the phase offset by generating reference IQ signals having different phases in the measurement mode.

Figure 6A:
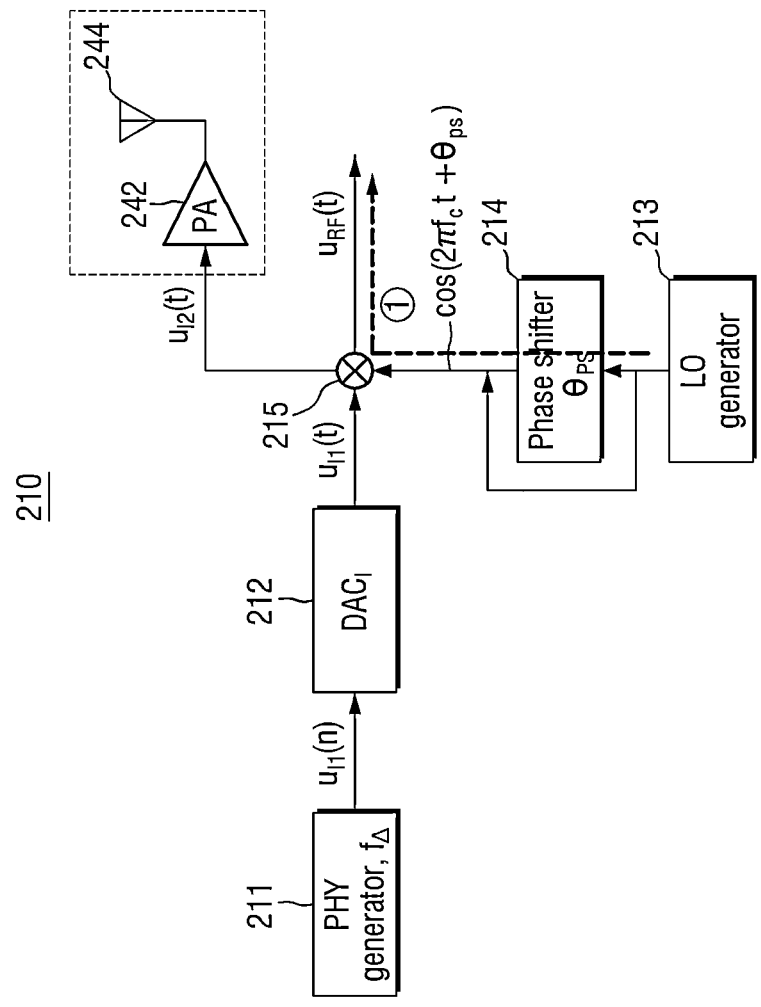
FIG. 6A is a diagram illustrating the feedback transmitter in the measurement mode according to some example embodiments.
Figure 6B:
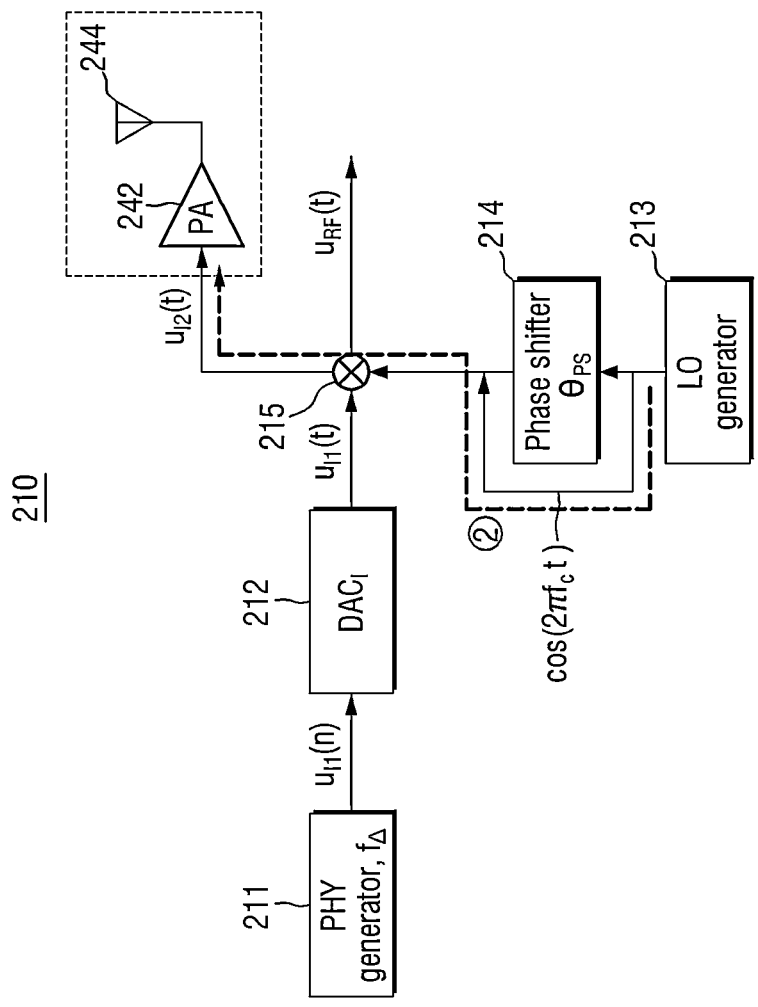
FIG. 6B is a diagram illustrating the feedback transmitter in the normal mode.

FIG. 6A is a diagram illustrating the feedback transmitter 210 in the measurement mode according to some example embodiments, and FIG. 6B is a diagram illustrating the feedback transmitter 210 in the normal mode.

Referring to FIGS. 6A and 6B, the feedback transmitter 210 may include a PHY generator 211, a digital-to-analog conversion (DAC$_I$) 212, a LO generator 213, a phase shifter 214, and an up-conversion mixer 215.

The PHY generator 211 modulates the reference signal or the transmission signal in the binary phase-shift keying (BPSK) manner and outputs the same signal to the BPSK signal $u_{fl}(n)$. In some example embodiments, the transmission signal is a signal to be transmitted by the second electronic device 20 over the wireless network (e.g., 30 in FIG. 1), and the reference signal is a preset signal with the reference tone frequency to generate the loopback signal in the measurement mode. Upon the operation in the normal mode (e.g., FIG. 6B), the PHY generator 211 may modulate the transmission signal of the second electronic device 20 to output $u_{f2}(t)$, and upon the operation in the measurement mode (e.g., FIG. 6A), the PHY generator 211 may modulate the reference signal to output a loopback signal $u_{RF}(t)$. The signal $u_{fl}(n)$ generated by the PHY generator may be a signal having the reference tone frequency $f_\Delta$.

The DAC$_I$ 212 converts the signal $u_{fl}(n)$ output from the PHY generator 211 into an analog signal and outputs the analog signal as a baseband signal $u_{fl}(t)$ as shown in Equation 2.

$$u_{fl}(t)=\cos(2\pi f_\Delta t) \quad \text{Equation 2}$$

The local oscillator (LO) generator 213 generates the LO signal $\cos(2\pi f_c t)$ with a carrier frequency $f_c$. For example, in the measurement mode, the LO generator 213 may be referred to as a feedback oscillator, and the LO signal may be referred to as a feedback oscillation signal. According to some example embodiments, the feedback oscillator may include the LO generator 213 and the phase shifter 214.

In the measurement mode (e.g., FIG. 6A), the feedback transmitter 210 activates the phase shifter 214. The phase shifter 214 shifts the LO signal $\cos(2\pi f_c t)$ by a preset phase $\theta_{ps1}$ or a preset phase $\theta_{ps2}$, and outputs the same signal. That is, the phase shifter 214 outputs the shifted LO signal $\cos(2\pi f_c t+\theta_{ps1})$ or $\cos(2\pi f_c t+\theta_{ps2})$. That is, the phase shifter 214 generates a first oscillation signal $\cos(2\pi f_c t+\theta_{ps1})$ and a second oscillation signal $\cos(2\pi f_c t+\theta_{ps2})$ in the measurement mode.

In the normal mode (e.g., FIG. 6B), the feedback transmitter 210 deactivates the phase shifter 214. That is, the feedback transmitter 210 fails to generate the loopback signal in the normal mode.

In the measurement mode, the up-conversion mixer 215 mixes a first phase shifted local oscillator (LO) signal $\cos(2\pi f_c t+\theta_{ps1})$ or a second phase shifted LO $\cos(2\pi f_c t+\theta_{ps2})$ with the baseband signal $u_{fl}(t)$, respectively, in the measurement mode, and generates and outputs first and second loopback signals $u_{RF}(t)$ as in Equations 3 and 4 (pass ① in FIG. 6A).

$$u_{RF,ps1}(t)=\text{Re}\{\alpha\cdot\cos(2\pi f_\Delta t)e^{j(2\pi f_c t+\theta_{ps1})}\}=\text{Re}\{u_{BB,ps1}(t)e^{j2\pi f_c t}\} \quad \text{Equation 3}$$

$$u_{RF,ps2}(t)=\text{Re}\{\alpha\cdot\cos(2\pi f_\Delta t)e^{j(2\pi f_c t+\theta_{ps2})}\}=\text{Re}\{u_{BB,ps2}(t)e^{j2\pi f_c t}\} \quad \text{Equation 4}$$

Alternatively, in the normal mode, the up-conversion mixer 215 mixes the local oscillator (LO) signal $\cos(2\pi f_c t)$ with the baseband signal $u_{fl}(t)$ based on the transmission signal in the normal mode, and generates the same signal to a passband transmission signal $u_{f2}(t)$ and outputs it to the power amplifier 242.

In the Equations 3 and 4, $\alpha$ is a gain of a loopback path (e.g., RF in FIG. 1) for connecting the feedback transmitter 210 and the receiver 220, $\theta_{ps1}$ is the first phase, and $\theta_{ps2}$ is the second phase for phase shifting.

When the loopback signal $u_{RF,ps1}(t)$ is expressed as $c=\alpha e^{j\theta_{ps1}}$, the baseband signal of the first loopback signal $u_{RF,ps1}(t)$ in Equation 3 is expressed as Equation 5, $$u_{BB,ps1}(t)=\alpha\cdot\cos(2\pi f_\Delta t)e^{j(\theta_{ps1})} \quad \text{Equation 5}$$

The baseband signal of the second loopback signal $u_{RF,ps2}(t)$ in Equation 4 may be expressed as Equation 6.

$$u_{BB,ps2}(t)=\alpha\cdot\cos(2\pi f_\Delta t)e^{j(\theta_{ps2})} \quad \text{Equation 6}$$

Figure 7:
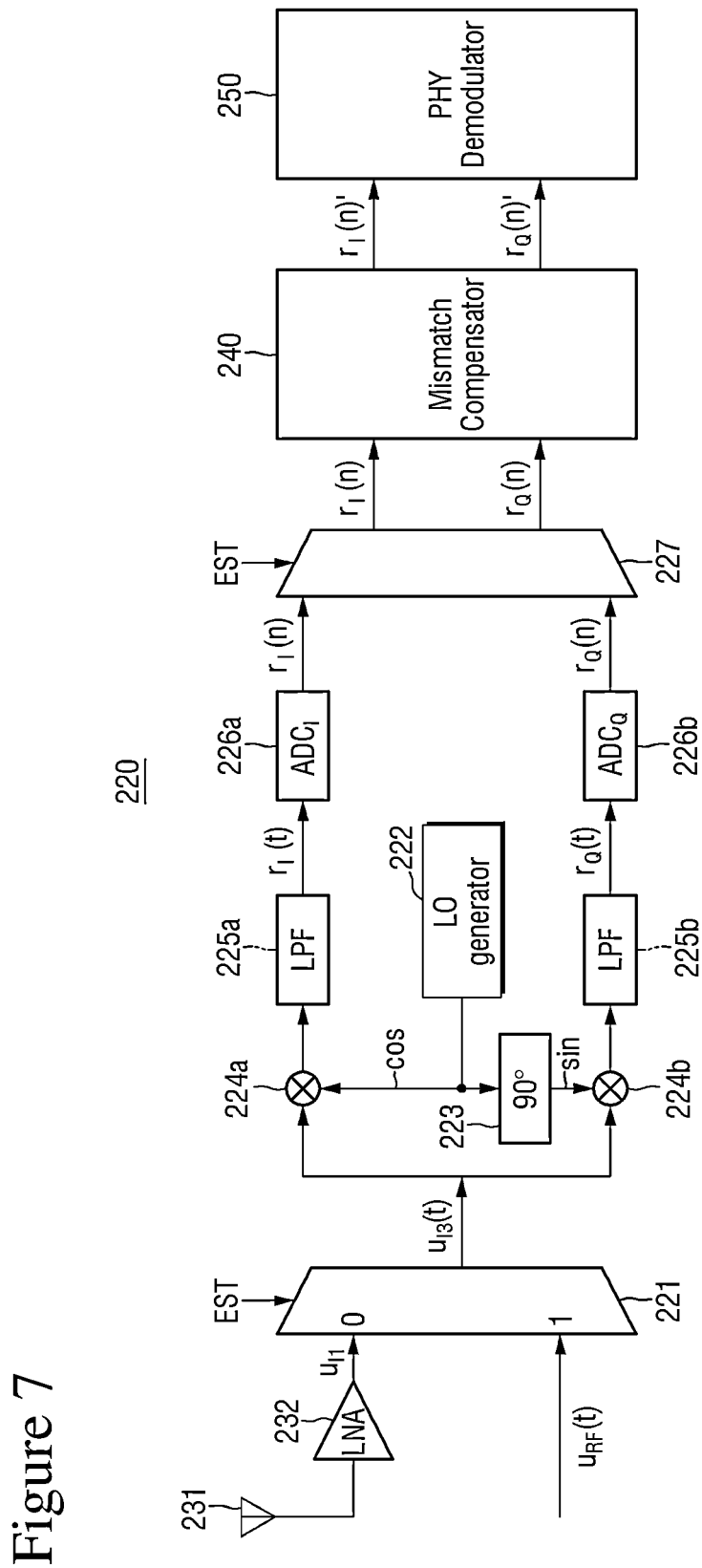
FIG. 7 illustrates the receiver according to some example embodiments.
Figure 8:
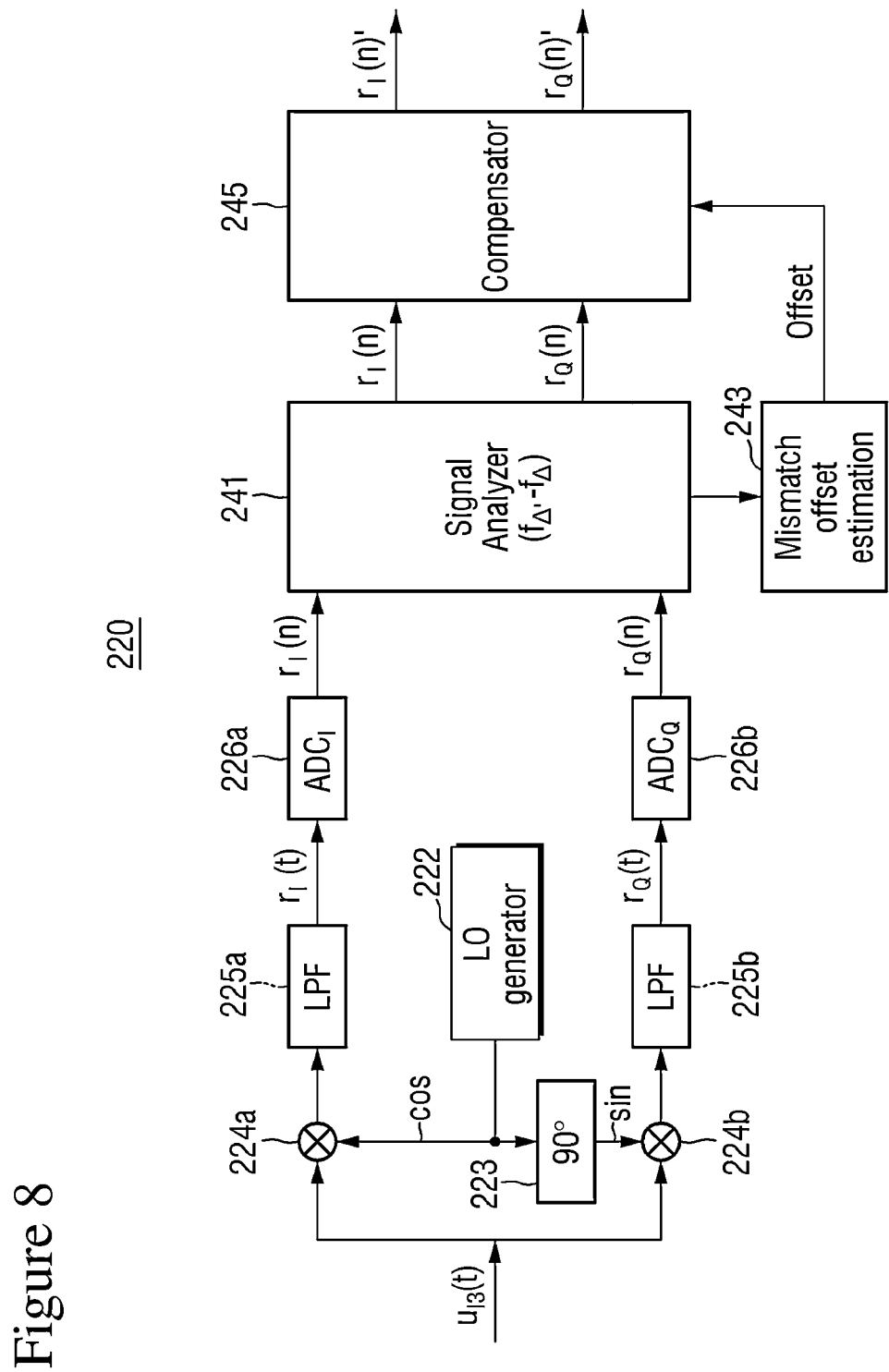
FIG. 8 illustrates in more detail a mismatch compensator in the receiver according to some example embodiments.

FIG. 7 illustrates the receiver 220 according to some example embodiments. FIG. 8 illustrates in more detail a mismatch compensator 240 in the receiver 220 according to some example embodiments.

Referring to FIG. 7, the receiver (220) estimates the gain offset and the phase offset of the IQ channel using at least two loopback signals with a phase difference in the measurement mode. The receiver 220 receives an input tone signal un that has passed through the low noise amplifier 232 via the reception antenna 231 in the normal mode and generates the input tone signal as the reception IQ signal based on the received signal. The receiver 220 outputs a correction IQ signal to reflect the estimated gain offset and phase offset in the reception IQ signal.

According to some example embodiments, the receiver 220 may include an input terminal selection circuit 221, an LO generator 222, a 90-degree phase shifter 223, down-conversion mixers 224a and 224b, ADCs 226A and 226B, an output terminal selection circuit 227, a mismatch compensator 240, and a PHY modulator 250.

The input terminal selection circuit 221 according to some example embodiments may select whether to operate in a measurement mode or a normal mode according to a control signal. For example, when the control signal selects the normal mode (e.g., EST=0), the receiver 220 may receive the input tone signal un received from the antenna 231 of the feedback transmitter 210 and output the same signal as the received signal $u_{f3}$. For example, when the control signal selects the measurement mode (e.g., EST=1), the receiver 220 may output the loopback signal $u_{RF}(t)$ generated from the feedback transmitter 210 as the reception signal $u_{f3}$.

The LO generator 222 may generate the LO signal with the carrier frequency $f_c$. According to some example embodiments, the LO generator 222 may be referred to as a receiving oscillator, and the LO signal generated by the LO generator 222 may be referred to as a receiver oscillation signal. According to some example embodiments, the receiving oscillator may be implemented by including the LO generator 222 and the 90-degree phase shifter 223.

The 90-degree phase shifter 223 shifts the LO signal by 90 degrees. That is, the LO generator 222 and the 90-degree phase shifter 223 may generate two LO signals having a 90-degree phase difference.

Ideally, when the LO signal is generated, the first LO signal may be $\cos(2\pi f_c t)$ and the second LO signal need to be generated as $-2\sin(2\pi f_c t)$, but in terms of circuit design and process, it is not easy to implement a receiver having an accurate 90-degree phase difference between I and Q channels and a gain 1. Accordingly, the actual receiver may have the phase offset and the gain offset, for example, when $\varnothing_{rx}$ is an IQ channel phase offset of the receiver 220, and $g_{rx}$ is an IQ channel gain offset of the receiver 220, the first LO signal may be $\cos(2\pi f_c t)$, and the second LO signal may be $-2g_{rx}\sin(2\pi f_c t+\varnothing_{rx})$. According to some example embodiments, the LO generator 222 and the 90-degree phase shifter 223 may be implemented as separate independent components or may be implemented as one combined component according to some example embodiments.

The down-converted mixers 224a and 224 b perform IQ mixing for the reception signal or the loopback signal, and generates the same as the reference IQ signal. For example, the down-converted mixers 224a and 224 b may mix the first LO signal (e.g., $\cos(2\pi f_c t)$) and the second LO (e.g., $-2g_{rx} \sin(2\pi f_c t+\emptyset_{rx})$) with the reception signal $u_{\beta}(t)$, respectively, and generate the mixed signals as the I channel signal and the Q channel signal, i.e., the reference IQ signals.

LPFs 225a and 225b perform low-pass filtering for the reference IQ signal and outputs the same signal.

For example, in the measurement mode, the down-conversion mixer 224a may generate a first reference I signal by mixing a first loopback signal $u_{RF,ps1}(t)$ and the first LO signal (e.g., $\cos(2\pi f_c t)$) based on the first phase $\theta_{ps1}$, and the down-conversion mixer 224b generate a first reference Q signal by mixing a first loopback signal $u_{RF,ps1}(t)$ and the second LO signal (e.g., $-2g_{rx} \sin(2\pi f_c t+\emptyset_{rx})$). Furthermore, the down-conversion mixer 224a may generate a second reference I signal by mixing a second loopback signal $u_{RF,ps2}(t)$ and the first LO signal (e.g., $\cos(2\pi f_c t)$) based on the second phase $\theta_{ps2}$, and the down-conversion mixer 224b may mix a second loopback signal $u_{RF,ps2}(t)$ and the second LO signal (e.g., $-2g_{rx} \sin(2\pi f_c t+\emptyset_{rx})$) to generate the same as a second reference Q signal.

For example, in the normal mode, the down-conversion mixer 224a may generate a reception I signal by mixing the input tone signal un and the second LO signal (e.g., cos ($2\pi f_c t$)) and the down-conversion mixer 224b may a reception I signal by mixing the input tone signal $u_{f1}$ and the second LO signal (e.g., $-2g_{rx} \sin(2\pi f_c t+\emptyset_{rx})$).

Specifically, in the measurement mode, the first loopback signal $u_{RF,ps1}(t)$ and the second loopback signal $u_{RF,ps2}(t)$ may express a first reference IQ signal $u_{RF,ps1}(t)$ and the second reference IQ signal $u_{RF,ps2}(t)$ output according to the IQ imbalance of the receiving circuit 200 in the down-conversion mixers 224a and 224b, as an analog baseband as in Equations 7 and 8.

$$r_{ps1}(t) = r_{I,ps1}(t) + jr_{Q,ps1}(t) = g_{1RX} \cdot u_{BB,ps1}(t) + g_{2RX} \cdot u^*_{BB,ps1}(t) \quad \text{Equation 7}$$

$$r_{ps2}(t) = r_{I,ps1}(t) + jr_{Q,ps2}(t) = g_{1RX} \cdot u_{BB,ps2}(t) + g_{2RX} \cdot u^*_{BB,ps2}(t) \quad \text{Equation 8}$$

In Equations 7 and 8, $r_{I,ps1}(t)$ is the first reference I channel signal, $r_{Q,ps1}(t)$ is the second reference Q channel signal, $$g_{1RX} = \frac{1 + g_{rx} \cdot e^{-j\phi_{rx}}}{2},$$

$$g_{2RX} = \frac{1 - g_{rx} \cdot e^{-j\phi_{rx}}}{2},$$

$u_{BB,ps1}(t)$ and $u_{BB,ps2}(t)$ are real tone signals, and $u^*_{BB,ps1}(t)$ and $u^*_{BB,ps2}(t)$ are imaginary tone signals.

The ADCs 226A and 226B convert an analog baseband signal into a digital baseband signal. For example, the first reference IQ signal $r_{ps1}(t)$ of the analog baseband in Equation 7 is converted and output into the first reference IQ signal $r_{ps1}(n)$ of the digital baseband, and the second reference IQ signal $r_{ps2}(t)$ of the analog baseband of Equation 8 may be converted and output into the second reference IQ signal $r_{ps2}(n)$ of the digital baseband and output.

In the measurement mode, the mismatch compensation unit 240 analyzes the first reference IQ signal $r_{ps1}(n)$ based on the reference tone frequency, the reference tone signal, and the first phase $\theta_{ps1}$, and analyzes the second reference IQ signal $r_{ps2}(n)$ based on the reference tone frequency, the reference tone signal and the second phase $\theta_{ps2}$, thus estimating the gain offset and the phase offset ($\theta_A - \theta_A'$) calculated from the set phase difference ($\theta_A = \theta_{ps1} - \theta_{ps2}$), and the actual phase difference ($\theta_A'$). After the input tone signal un received in the normal mode is reflected in the gain offset and the phase offset estimated from the reception IQ signal $r_I(n)$, $r_Q(n)$ subjected to the down-conversion mixing, the mismatch compensation unit 240 outputs it as a correction IQ signals $r_I(n)'$ and $r_Q(n)'$.

The PHY demodulator 250 demodulates the correction IQ signals $r_I(n)'$ and $r_Q(n)'$ in a binary phase-shift keying (BPSK) manner, which is the same as a preset manner, for example, a modulation method used by the transmitting device 20.

Referring to FIG. 8, according to some example embodiments, the mismatch compensator 240 may include a signal analyzer 241, an offset estimation unit 243, and a signal compensator 245.

The signal analyzer 241 analyzes the signal compared to at least two reference IQ signals output from the ADCs 226A and 226B. The offset estimator 243 may estimate the gain offset and the phase offset from analysis results of the signal analyzer 241 based on the reference tone frequency and at least two different preset phases. The signal compensator 245 generates and outputs the correction IQ signal in which the estimated gain offset and phase offset are reflected in the reception IQ signal.

Specifically, the signal analyzer 241 measures the reception signal R ($f_A$) at the reference tone frequency $f_A$. For example, the signal analyzer 241 analyzes the first reference IQ signal $r_{ps1}$ (t) in which the first loopback signal $r_{ps1}(t)$ subjected to down-conversion mixing in the first loopback signal $u_{RF,ps1}(t)$, based on the first phase $\theta_{ps1}$, the reference tone signal, and the reference tone frequency $f_A$. The signal analyzer 241 analyzes the second reference IQ signal $r_{ps2}(t)$ subjected to down-conversion mixing in the second loopback signal $u_{RF,ps2}(t)$ based on the second phase $\theta_{ps2}$, the reference tone signal, and the reference tone frequency f.

$R_{ps1}(f_A)$ of Equation 7 expresses a first reference IQ signal r_ps1($t$) measured by receiving the first loopback signal $r_{ps1}(t)$ measured by receiving the first loopback signal $u_{RF,ps1}(t)$ in the receiver 220, as a frequency domain, and may be expressed as Equation 9.

$$R_{ps1}(f_\Delta) = \frac{1}{2}g_{1RX} \cdot c + \frac{1}{2}g_{1RX} \cdot c^* = \qquad \text{<Equation 9>}$$

$$\frac{a}{4}(e^{j\theta_{ps1}} + g_{rx} \cdot e^{-j\phi_{rx}}e^{j\theta_{ps1}} + e^{-j\theta_{ps1}} - g_{rx} \cdot e^{j\phi_{rx}}e^{-j\theta_{ps1}}) =$$

$$\frac{a}{2}(\cos(\theta_{ps1}) - jg_{rx} \cdot \sin(\phi_{rx} - \theta_{ps1})) = \frac{a}{2}$$

$$(\cos(\theta_{ps1}) + jg_{rx} \cdot \cos(\phi_{rx})\sin(\theta_{ps1}) - jg_{rx} \cdot \sin(\phi_{rx})\cos(\theta_{ps1}))$$

In Equation 9, when expressed as $c = ae^{j\theta_{ps1}}$, $R_{ps1}$, $f_A$) may be expressed as an equation for the first phase $\theta_{ps1}$, the phase offset $\phi_{rx}$, and gain offset $g_{rx}$.

Similarly, $R_{ps2}(f_A)$ of Equation 8 expresses a second reference IQ signal $r_{ps2}(t)$ measured by receiving the second loopback signal $u_{RF,ps2}(t)$ in the receiver 220, as a frequency domain, and may be expressed as Equation 10.

$$R_{ps2}(f_\Delta) = \frac{1}{2}g_{1RX} \cdot c + \frac{1}{2}g_{1RX} \cdot c^* =$$ <Equation 10>

$$\frac{a}{4}\left(e^{j\theta_{ps2}} + g_{rx} \cdot e^{-j\phi_{rx}}e^{j\theta_{ps2}} + e^{-j\theta_{ps2}} - g_{rx} \cdot e^{j\phi_{rx}}e^{-j\theta_{ps2}}\right) =$$

$$\frac{a}{2}(\cos(\theta_{ps2}) - jg_{rx} \cdot \sin(\phi_{rx} - \theta_{ps2})) = \frac{a}{2}(\cos(\theta_{ps2}) +$$

$$jg_{rx} \cdot cois(\phi_{rx})\sin(\theta_{ps2}) - jg_{rx} \cdot \sin(\phi_{rx})\cos(\theta_{ps2}))$$

According to Equations 9 and 10, a measurement value $\overline{a \cdot \cos}(\theta_{ps1})$ of $\cos(\theta_{ps1})$ in the first phase $\theta_{ps1}$ and a measurement value $\overline{a \cdot \cos}(\theta_{ps2})$ of $\cos(\theta_{ps2})$ in the second phase $\theta_{ps2}$ may be calculated as in Equations 11 and 12.

$$\overline{a \cdot \cos}(\theta_{ps1}) = (R_{ps1}(f_\Delta) + R^*_{ps1}(f_\Delta))$$ Equation 11

$$\overline{a \cdot \cos}(\theta_{ps2}) = (R_{ps2}(f_\Delta) + R^*_{ps2}(f_\Delta))$$ Equation 12

The first phase $\theta_{ps1}$ and the second phase $\theta_{ps2}$ set in the feedback transmitter 210 are preset (or alternatively, desired) and known values, and when $\theta_{ps2} = \theta_{ps1} + \theta_{ps\Delta}$ is in consideration of the difference $\theta_{ps\Delta}$ between the two shifted phases, the relationship between Equation 11 and Equation 12 may be represented as Equation 13.

$$a \cdot \cos(\theta_{ps2}) = a \cdot \cos(\theta_{ps1} + \theta_{ps\Delta}) = a \cdot \cos(\theta_{ps1})\sin(\theta_{ps1})\sin(\theta_{ps\Delta})$$ <Equation 13>

When Equation 13 is summarized as an equation for $\overline{a \cdot \sin}(\theta_{ps1})$, it can be expressed as Equation 14.

$$\overline{a \cdot \sin}(\theta_{ps1}) = \frac{\overline{a \cdot \cos}(\theta_{ps1})\cos(\theta_{ps\Delta}) - \overline{a \cdot \cos}(\theta_{ps2})}{\sin(\theta_{ps\Delta})}$$ <Equation 14>

The measurement value $\overline{a \cdot \cos}(\theta_{ps1})$ of $\cos(\theta_{ps1})$ in the first phase $(\theta_{ps1})$ and a measured value $\overline{a \cdot \cos}(\theta_{ps2})$ cos $(\theta_{ps2})$ in the second phase $\theta_{ps2}$ in Equation 14 can be estimated via Equation 11 and Equation 12, and $\cos(\theta_{ps\Delta})$ and $\sin(\theta_{ps\Delta})$ can be calculated from a preset and known $\theta_{ps\Delta}$, and accordingly, $\overline{a \cdot \sin}(\theta_{ps1})$ may be calculated in Equation 14.

Similarly, when $\overline{a \cdot \sin}(\theta_{ps2})$ for the second phase is derived in the same manner as Equation 13, it can be summarized as Equation 15, and $\cos(\theta_{ps\Delta})$ and $\sin(\theta_{ps\Delta})$ can be calculated from the present and known phase difference $(\theta_{ps\Delta})$ between the first phase $\theta_{ps1}$ and the second phase $\theta_{ps2}$.

$$\overline{a \cdot \sin}(\theta_{ps2}) = \overline{a \cdot \sin}(\theta_{ps1})\cos(\theta_{ps\Delta}) + \overline{a \cdot \cos}(\theta_{ps1})\sin(\theta_{ps\Delta})$$ Equation 15

When $\overline{a \cdot \cos}(\theta_{ps1})$, $\overline{a \cdot \cos}(\theta_{ps2})$, $\overline{a \cdot \sin}(\theta_{ps1})(\theta_{ps1})$ and $\overline{a \cdot \sin}(\theta_{ps2})$ are obtained via Equations 11 to 15, respectively, the first phase difference IQ signal $R_{ps1}(f_\Delta)$ based on the first reference IQ signal $r_{ps1}(t)$ and the second phase difference IQ signal $R_{ps2}(f_\Delta)$ based on the second reference IQ signal $r_{ps1}(t)$ in Equation 11 and Equation 12 are may be expressed like Equation 16 and Equation 17.

$$(g_{rx}\cos(\phi_{rx}) \cdot \overline{a \cdot \sin}(\theta_{ps1}) - g_{rx}\sin(\phi_{rx}) \cdot \overline{a \cdot \cos}(\theta_{ps1})) = 2 \cdot Im\{R_{ps1}(f_\Delta)\}$$ <Equation 16>

$$(g_{rx}\cos(\phi_{rx}) \cdot \overline{a \cdot \sin}(\theta_{ps1}) - g_{rx}\sin(\phi_{rx}) \cdot \overline{a \cdot \cos}(\theta_{ps2})) = 2 \cdot Im\{R_{ps2}(f_\Delta)\}$$ <Equation 17>

When Equation 16 and Equation 17 are expressed as matrices, they can be expressed like Equation 18.

$$\begin{bmatrix} \overline{a \cdot \sin}(\theta_{ps1}) & -\overline{a \cdot \cos}(\theta_{ps1}) \\ \overline{a \cdot \sin}(\theta_{ps2}) & -\overline{a \cdot \cos}(\theta_{ps2}) \end{bmatrix} \begin{bmatrix} g_{rx}\cos(\phi_{rx}) \\ g_{rx}\sin(\phi_{rx}) \end{bmatrix} =$$ <Equation 18>

$$\begin{bmatrix} 2 \cdot Im\{R_{ps1}(f_\Delta)\} \\ 2 \cdot Im\{R_{ps2}(f_\Delta)\} \end{bmatrix}$$

In other words, Equation 18 shows the measured reception signal divided into a matrix $$\begin{bmatrix} \overline{a \cdot \sin}(\theta_{ps1}) & -\overline{a \cdot \cos}(\theta_{ps1}) \\ \overline{a \cdot \sin}(\theta_{ps2}) & -\overline{a \cdot \cos}(\theta_{ps2}) \end{bmatrix}$$

for the first phase and the second phase, and a matrix $$\begin{bmatrix} g_{rx}\cos(\phi_{rx}) \\ g_{rx}\sin(\phi_{rx}) \end{bmatrix}$$

for the phase offset $\phi_{rx}$ and the gain offset $g_{rx}$ in the reference tone signal. Equation 18 may be represented by Equation 19 of signal components $g_{rx}\cos(\phi_{rx})$ and $g_{rx}\sin(\phi_{rx})$ for offset.

$$\begin{bmatrix} g_{rx}\cos(\phi_{rx}) \\ g_{rx}\sin(\phi_{rx}) \end{bmatrix} = \begin{bmatrix} \overline{a \cdot \sin}(\theta_{ps1}) & -\overline{a \cdot \cos}(\theta_{ps1}) \\ \overline{a \cdot \sin}(\theta_{ps2}) & -\overline{a \cdot \cos}(\theta_{ps2}) \end{bmatrix}^{-1}$$ <Equation 19>

$$\begin{bmatrix} 2 \cdot Im\{R_{ps1}(f_\Delta)\} \\ 2 \cdot Im\{R_{ps2}(f_\Delta)\} \end{bmatrix} = \begin{bmatrix} A \\ B \end{bmatrix}$$

In Equation 19, the phase offset $\phi_{rx}$ and the gain offset $g_{rx}$ may be obtained as in Equation 20.

$$\hat{g}_{rx} = \sqrt{A^2 + B^2}$$

$$\hat{\phi}_{rx} = \text{angle}(A + jB)$$ <Equation 20>

As described above, the offset estimator 243 may estimate the gain offset $g_{rx}$ and the phase offset $\phi_{rx}$ in the IQ channel of the receiver of the analysis results of the signal analyzer 241 based on different phases $\theta_{ps1}$ and $\theta_{ps2}$ having the preset difference, and the reference tone frequency $f_\Delta$.

Figure 9:
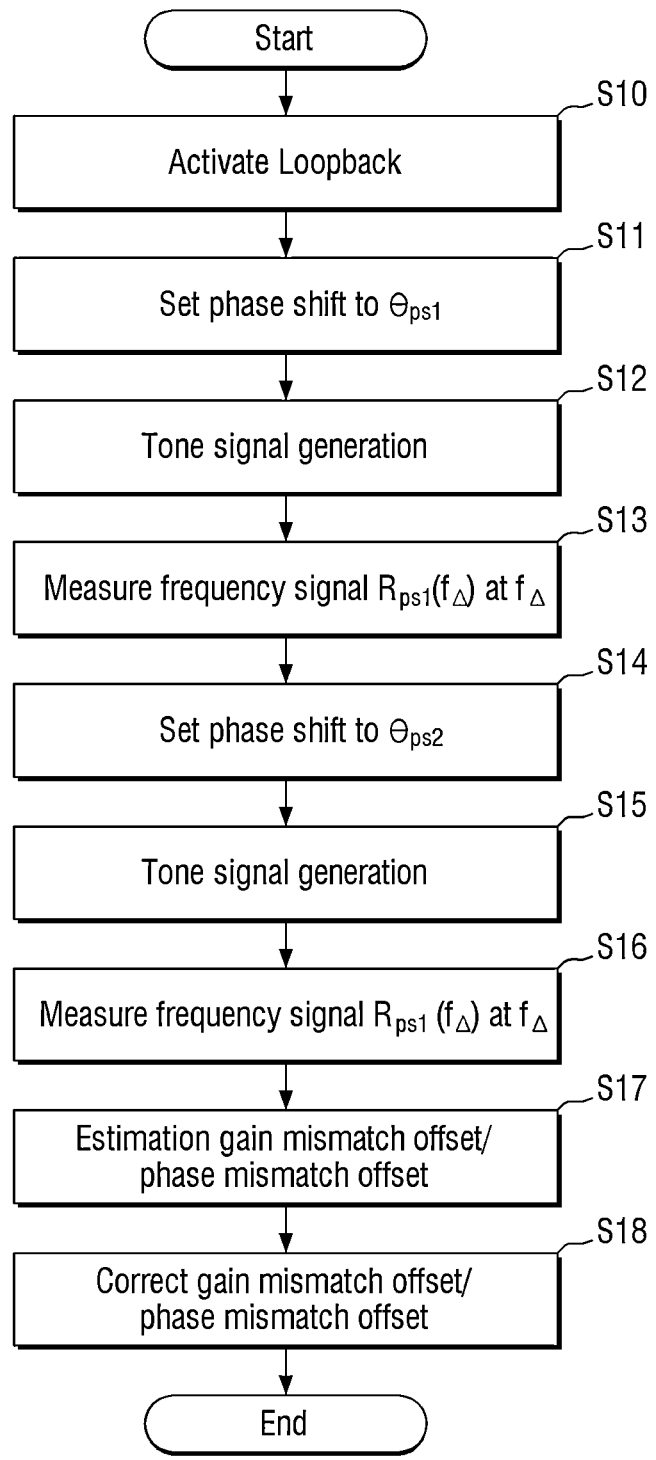
FIG. 9 is a flowchart illustrating a method of operating the electronic device according to some example embodiments.

FIG. 9 is a flowchart illustrating a method of operating the electronic device 20 according to some example embodiments.

Referring to FIGS. 1, 5, and 9, the electronic device 20 according to some example embodiments may include a feedback transmitter 210 and a receiver 220, and may activate a loopback path of the feedback transmitter 210 according to an operation mode (S10). For example, in the measurement mode, the feedback transmitter 210 may be activated to generate a loopback signal $u_{RF(t)}$ that simulates a transmission signal based on the reference tone signal of the second electronic device 20. In the normal mode, according to some example embodiments, the feedback transmitter 210 may be used as a transmission device for deactivating the loopback path and transmitting the transmission signal of the second electronic device 20 to the first electronic device 10.

The electronic device 20 sets a phase shift value to a preset first phase $\theta_{ps1}$ in the feedback transmitter 210 (S11), and shifts a first LO signal $\cos(2\pi f_c t)$ with the carrier frequency $f_c$ to a first phase. The first LO signal $\cos(2\pi f_c t + \theta_{ps1})$ shifted to the first phase is subject to up-conversion mixing to a reference tone signal with a reference tone frequency and is output to the receiver 220 as a first loopback signal $u_{RF,ps1}(t)$ (S12). The receiver 220 measures the first reception signal $R_{ps1}(f_\Delta)$ at the reference tone frequency $f_\Delta$ (S13). In this case, the first reception signal $R_{ps1}(f_\Delta)$ is a first loopback signal $u_{RF,ps1}(t)$ received from the receiver 220.

In the feedback transmitter 210, the receiving apparatus sets a phase shift value to a second phase $\theta_{ps2}$ having a preset phase difference $\theta_{ps\Delta}$ from the first phase $\theta_{ps1}$ (S14), and shifts a first LO signal $\cos(2\pi f_c t)$ with the carrier frequency to the second phase. The first LO signal $\cos(2\pi f_c t + \theta_{ps2})$ shifted to the second phase is subject to the up-conversion mixing into the reference tone signal with the reference tone frequency and is output to the receiver 220 as the second loopback signal $uu_{RF,ps2}(t)$ (S15). The receiver 220 measures the second reception signal $R_{ps2}(f_\Delta)$ at the reference tone frequency $f_\Delta$ (S16).

The electronic device 20 analyzes the first reception signal $R_{ps1}(f_\Delta)$, and the second reception signal $R_{ps2}(f_\Delta)$ based on the preset and known values such as a first phase $\theta_{ps1}$, a second phase $\theta_{ps2}$, the phase difference $\theta_{ps\Delta}$, the reference tone frequency $f_\Delta$, and the reference tone signal. As result of the analysis, the gain $g_{rx}$ and the phase offset $\varnothing_{rx}$ are estimated from the reception signal and the second signal (S17), the estimated gain offset $g_{rx}$ and phase offset $\varnothing_{rx}$ are reflected in the reception IQ signal, thus correcting the offset and outputting the correction IQ signal (S18).

Figure 10:
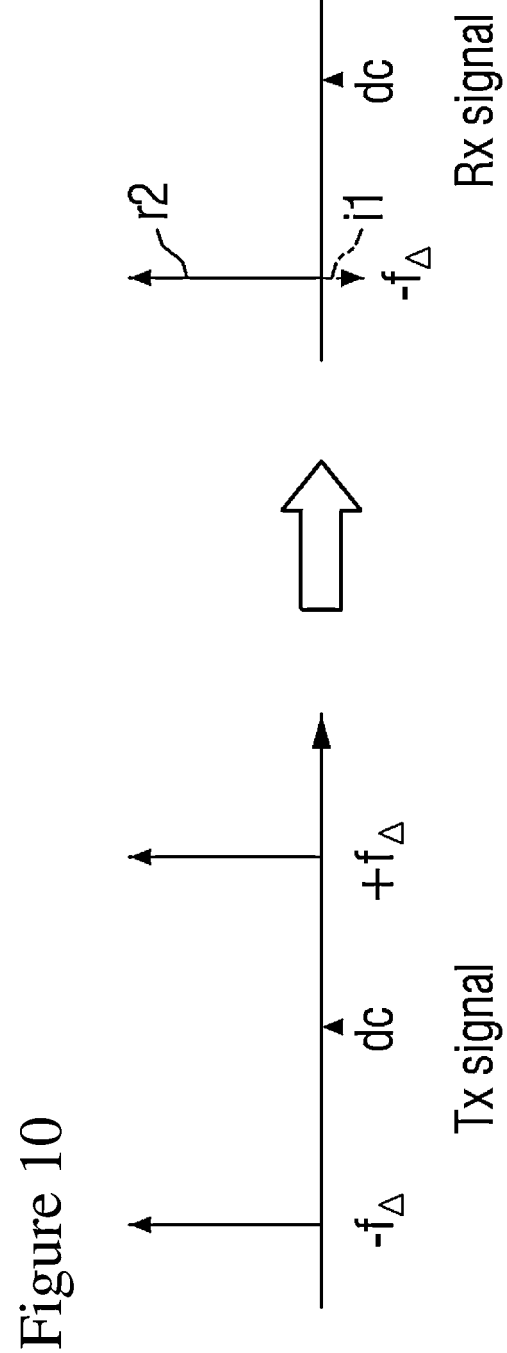
FIG. 10 illustrates a frequency spectrum in a case of operating as the receiving device according to some example embodiments.

FIG. 10 illustrates a frequency spectrum in a case of operating as the receiving device according to some example embodiments.

Referring to FIG. 10, even when a transmission circuit 100 transmits a transmission signal with all the frequency component at the two frequencies $f_\Delta$ and $-f_\Delta$ based on the real signal, the electronic device 20 according to some example embodiments may effectively estimate and compensate for imbalance of the IQ channel.

Referring to the illustrated spectrum, when the transmission signal Tx Signal has frequency components at each of the reference tone frequency $f_\Delta$ and frequency $-f_\Delta$, the reception circuit 200 may receive not only the real signal r of the transmission signal but also the imaginary signal I, as already described in FIG. 3.

However, according to some example embodiments, the electronic device 20 may be phase-shifted to at least two different preset phases without a separate local oscillator (LO) generator to calculate the phase offset and the gain offset due to the IQ imbalance, and reflect and output the calculated offset in the reception IQ signal received in the normal mode. In addition, even if the imaginary signal i is received, since it has a different phase from the real signal r, there is an advantage of accurately measuring, in the receiving apparatus (200), the size and phase component of the real signals r1 and r2, and the size and phase component of the imaginary signals i1 and i2, respectively. In addition, the electronic device 20 may generate the real signal, that is, the loopback signal, via the feedback transmitter 210, thereby reducing the complexity of the device.

Technical aspects to be achieved through some example embodiments of the present inventive concepts provide an electronic device capable of estimating and compensating for in-phase/quadrature imbalance, and an operating method therefor.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

Although some example embodiments of the present inventive concepts have been described above with reference to the accompanying drawings, the present inventive concepts are not limited to the example embodiments herein, but may be implemented in various different ways, and the present inventive concepts may be embodied in many different forms without changing technical subject matters and essential features as will be understood by those skilled in the art. Therefore, example embodiments set forth herein are for example only and are not to be construed as a limitation.

What is claimed is:

1. An electronic device, comprising:
a feedback oscillator configured to output a first oscillation signal and a second oscillation signal, the second oscillation signal having a defined phase difference from the first oscillation signal, the feedback oscillator including a phase shifter configured to receive the first oscillation signal and output the second oscillation signal;
an up-conversion mixer configured to output a first loopback signal obtained by mixing the first oscillation signal with a reference tone signal, and output a second loopback signal obtained by mixing the second oscillation signal with the reference tone signal, wherein the feedback oscillator includes a local oscillator configured to supply the first oscillation signal to the up-conversion mixer when the electronic device is operating in a normal mode, and the phase shifter is configured to supply the second oscillation signal to the up-conversion mixer when the electronic device is operating in a measurement mode; and
a receiver configured to generate a first reference IQ signal from the first loopback signal, generate a second reference IQ signal from the second loopback signal, and compare an actual phase difference between the first reference IQ signal and the second reference IQ signal with the defined phase difference.

2. The electronic device of claim 1, wherein the receiver comprises:
a down-conversion mixer configured to generate the first reference IQ signal by mixing the first loopback signal with a receiver local oscillation signal, and generate the second reference IQ signal by mixing the second loopback signal with the receiver local oscillation signal; and
a mismatch compensator configured to compare the actual phase difference between the first reference IQ signal and the second reference IQ signal with the defined phase difference, and correct a reception IQ signal to reflect a result of the actual phase difference with the defined phase difference.

3. The electronic device of claim 2, wherein the mismatch compensator comprises:
a signal analyzer configured to analyze the first reference IQ signal and the second reference IQ signal mixed into the reference tone signal with a reference tone frequency and a phase value set by the phase shifter;
an offset estimation unit configured to compare the actual phase difference with the defined phase difference to output a phase offset, and analyze the first reference IQ signal and second reference IQ signal mixed into the reference tone signal to output a gain offset; and a signal compensator configured to generate a correction IQ signal to reflect the gain offset and the phase offset into the reception IQ signal.

4. The electronic device of claim 1, wherein the phase shifter is configured to output a feedback oscillation signal as the first oscillation signal, and output the second oscillation signal to phase-shift the first oscillation signal to the defined phase difference.

5. The electronic device of claim 4, wherein
the up-conversion mixer is connected to an output terminal of a digital-to-analog converter (DAC) configured to output the reference tone signal that is subjected to digital-to-analog conversion,
the up-conversion mixer is configured to output the first loopback signal by mixing the reference tone signal with the first oscillation signal, and
the up-conversion mixer is configured to output the second loopback signal by mixing the reference tone signal with the second oscillation signal.

6. The electronic device of claim 4, wherein in the normal mode,
the phase shifter is inactive, and
the up-conversion mixer is configured to mix the feedback oscillation signal of the feedback oscillator with the reference tone signal, and output the mixed signal to an antenna via a power amplifier.

7. The electronic device of claim 1, wherein the electronic device is configured to use burst position modulation (BPM)-binary phase-shift keying (BPSK) in ultra-wideband (UWB) communication.

8. An electronic device, comprising:
a feedback oscillator configured to generate a feedback oscillation signal;
a phase shifter configured to output a first oscillation signal having the feedback oscillation signal shifted to a first phase, and a second oscillation signal having the feedback oscillation signal shifted to a second phase;
an up-conversion mixer configured to generate and output a first loopback signal by mixing the first oscillation signal with a reference tone signal, and generate and output a second loopback signal by mixing the second oscillation signal with the reference tone signal in a measurement mode; and
a receiver configured to generate a first reference IQ signal by down-conversion mixing the first loopback signal, and generate a second reference IQ signal by down-conversion mixing the second loopback signal in the measurement mode, wherein the feedback oscillator is configured to supply the feedback oscillation signal to the up-conversion mixer when the electronic device is operating in a normal mode, and the phase shifter is configured to supply the second oscillation signal to the up-conversion mixer when the electronic device is operating in the measurement mode,
wherein the receiver is configured to estimate a phase offset by comparing a defined phase difference between the first oscillation signal and the second oscillation signal with an actual phase difference between the first reference IQ signal and the second reference IQ signal, and estimate a gain offset from the first reference IQ signal and second reference IQ signal.

9. The electronic device of claim 8, wherein the receiver comprises:
a down-conversion mixer configured to down-conversion mix the first loopback signal and the second loopback signal with a receiver oscillation signal in the measurement mode, and output the mixed first loopback signal as the first reference IQ signal and mixed second loopback signal as the second reference IQ signal;
a low pass filter configured to low-pass filter the first reference IQ signal and the second reference IQ signal;
an analog-to-digital converter (ADC) configured to convert the filtered first reference IQ signal and second reference IQ signal into a digital format; and
a mismatch compensator configured to output the actual phase difference between the converted first reference IQ signal and second reference IQ signal, and compare the actual phase difference with the defined phase difference.

10. The electronic device of claim 9, wherein the mismatch compensator is configured to analyze the first reference IQ signal mixed into a reference tone signal with a reference tone frequency and the first phase set by the phase shifter, analyze the second reference IQ signal mixed into the reference tone signal and a second phase having the defined phase difference from the first phase set by the phase shifter, estimate a phase offset between the defined phase difference and the actual phase difference, and estimate a gain offset by analyzing the first and second reference IQ signals with the reference tone signals.

11. The electronic device of claim 10, further comprising:
an antenna configured to receive an input tone signal,
wherein the receiver is configured to generate a reception IQ signal by down-conversion mixing the input tone signal to the receiver oscillation signal in a normal mode, and output a correction IQ signal that compensates for the reception IQ signal with the gain offset and the phase offset.

12. The electronic device of claim 9, wherein the mismatch compensator comprises:
a signal analyzer configured to analyze the first reference IQ signal and the second reference IQ signal mixed into the reference tone signal and the defined phase difference;
an offset estimation unit configured to calculate the gain offset and the phase offset between the actual phase difference and the defined phase difference according to analysis results of the signal analyzer; and
a signal compensator configured to generate a correction IQ signal to compensate a reception IQ signal with the gain offset and the phase offset.

13. The electronic device of claim 8, further comprising:
a PHY generator configured to modulate and output the reference tone signal; and
a digital-to-analog converter (DAC) configured to convert the modulated reference tone signal into an analog signal;
wherein the up-conversion mixer is configured to output the first and second loopback signals to a loopback path, and
wherein the loopback path is a connection between a feedback transmitter and an input terminal of the receiver.

14. A method for operating an electronic device, the method comprising:
generating a first oscillation signal by phase-shifting a feedback oscillation signal to a first phase, and generating a second oscillation signal by phase shifting the feedback oscillation signal to a second phase in a measurement mode;
generating a first loopback signal by up-conversion mixing a reference tone signal with the first oscillation signal, and generating a second loopback signal by up-conversion mixing the reference tone signal with the second oscillation signal, wherein generating the first loopback signal includes receiving the feedback oscillation signal from a local oscillator when the electronic device is operating a normal mode, and generating the second loopback signal includes receiving the second oscillation signal from a phase shifter when the electronic device is operating in the measurement mode;

generating a first reference IQ signal by down-conversion mixing the first loopback signal with a receiver oscillator signal in a receiver;

generating a second reference IQ signal by down-conversion mixing the second loopback signal with the receiver oscillator signal in the receiver; and estimating a gain offset and a phase offset of the receiver according to the first reference IQ signal and the second reference IQ signal.

15. The method for operating an electronic device of claim 14, wherein the estimating comprises:

calculating the phase offset by comparing an actual phase difference between the first reference IQ signal and the second reference IQ signal with a defined phase difference; and calculating the gain offset according to signal sizes of the first reference IQ signal and the second reference IQ signal.

16. The method for operating an electronic device of claim 14, wherein the receiver oscillator signal includes a first receiver oscillation signal having a third phase and a second receiver oscillation signal having a phase difference of 90 degrees from the third phase, and the electronic device is configured to generate a first reference I signal having the first loopback signal downmixed to the first receiver oscillation signal, and a first reference Q signal having the first loopback signal downmixed to the second receiver oscillation signal, and the electronic device is configured to generate a second reference I signal having the second loopback signal downmixed to the first receiver oscillation signal, and a second reference Q signal having the second loopback signal downmixed to the second receiver oscillation signal.

17. The method for operating an electronic device of claim 16, wherein the estimating comprises:

performing analog-to-digital conversion for the first reference IQ signal and the second reference IQ signal;

analyzing a converted first reference IQ signal and a converted second reference IQ signal mixed into a reference tone frequency, the reference tone signal, the first phase, and the second phase;

determining a difference between a defined phase difference and the actual phase difference as the phase offset; and determining the gain offset from the phase offset, the first reference IQ signal and the second reference IQ signal.

18. The method for operating an electronic device of claim 14, wherein the receiver is configured to, receive an input tone signal via a receiving antenna in a normal mode, generate a reception IQ signal by performing down-conversion mixing of the input tone signal with the receiver oscillation signal, and compensate for the reception IQ signal with the estimated gain offset and phase offset to output a correction IQ signal.

19. The method for operating an electronic device of claim 18, wherein the first loopback signal and the second loopback signal are not generated in the normal mode.

20. The method for operating an electronic device of claim 14, wherein the electronic device is configured to use burst position modulation (BPM)-binary phase-shift keying (BPSK) in ultra-wideband (UWB) communication.

* * * * *